United States Patent [19]

Pughe, Jr. et al.

[11] Patent Number: 5,226,043

[45] Date of Patent: Jul. 6, 1993

[54] APPARATUS AND METHOD FOR DATA ERROR DETECTION AND CORRECTION AND ADDRESS ERROR DETECTION IN A MEMORY SYSTEM

[75] Inventors: Earle W. Pughe, Jr., Weston, Mass.; Robert P. Landstrom, Alpharetta, Ga.; H. Frank Howes, Berlin, Mass.

[73] Assignee: Raytheon Company, Lexington, Mass.

[21] Appl. No.: 634,632

[22] Filed: Dec. 27, 1990

[51] Int. Cl.⁵ ............................................. G06F 11/10
[52] U.S. Cl. .................................. 371/40.1; 371/51.1
[58] Field of Search ...................... 371/40.1, 51.1, 37.1

[56] References Cited

U.S. PATENT DOCUMENTS

| | | | |
|---|---|---|---|
| 3,914,741 | 10/1975 | Bonser et al. | 371/51.1 |
| 3,963,908 | 6/1976 | Das | 371/51.1 |
| 4,035,766 | 7/1977 | Barker | 371/51.1 |
| 4,142,174 | 2/1979 | Chen et al. | 340/146 |
| 4,271,521 | 6/1981 | Mahmood | 371/51.1 |
| 4,464,753 | 8/1984 | Chen | 371/40.1 |
| 4,661,955 | 4/1987 | Arlington et al. | 371/13 |
| 4,763,332 | 8/1988 | Glover | 371/37.5 |
| 4,862,463 | 8/1989 | Chen | 371/40.1 |
| 4,926,426 | 5/1990 | Scheuneman et al. | 371/40.1 |
| 4,928,280 | 5/1990 | Nielson et al. | 371/39.1 |
| 4,961,193 | 10/1990 | Debord et al. | 371/37.2 |

OTHER PUBLICATIONS

"Error-Correcting Codes for Semiconductor Memory Applications: A State-of-the-Art Review," C. L. Chen, M. Y. Hsiao, IBM J. Res. Develop—vol. 28, No. 2, Mar. 1984.

*Primary Examiner*—Charles E. Atkinson
*Attorney, Agent, or Firm*—Walter F. Dawson; Richard M. Sharkansky

[57] ABSTRACT

An error detection and correction apparatus and method in a memory system for performing single symbol error correction and at least double symbol error detection of data errors and single symbol error detection and at least double symbol error detection of addressing errors using a modified Reed Solomon code. A first of three parity symbols in a codeword is used to determine the value of a single symbol error, if any, over a memory word comprising data symbols and its corresponding address comprising address symbols. A second parity symbol is used to locate a single symbol error, and a third parity symbol is used to detect at least two errors in the data and address symbols. The three parity symbols are used to generate syndromes which determine if there is an error and what corrective action to take. In calculating product terms for the modified Reed Solomon code, a technique of bit padding that requires no additional memory is used to match the number of bits needed in the Reed Solomon code data symbols to the bit width of a memory chip of a memory array in the memory system.

27 Claims, 7 Drawing Sheets

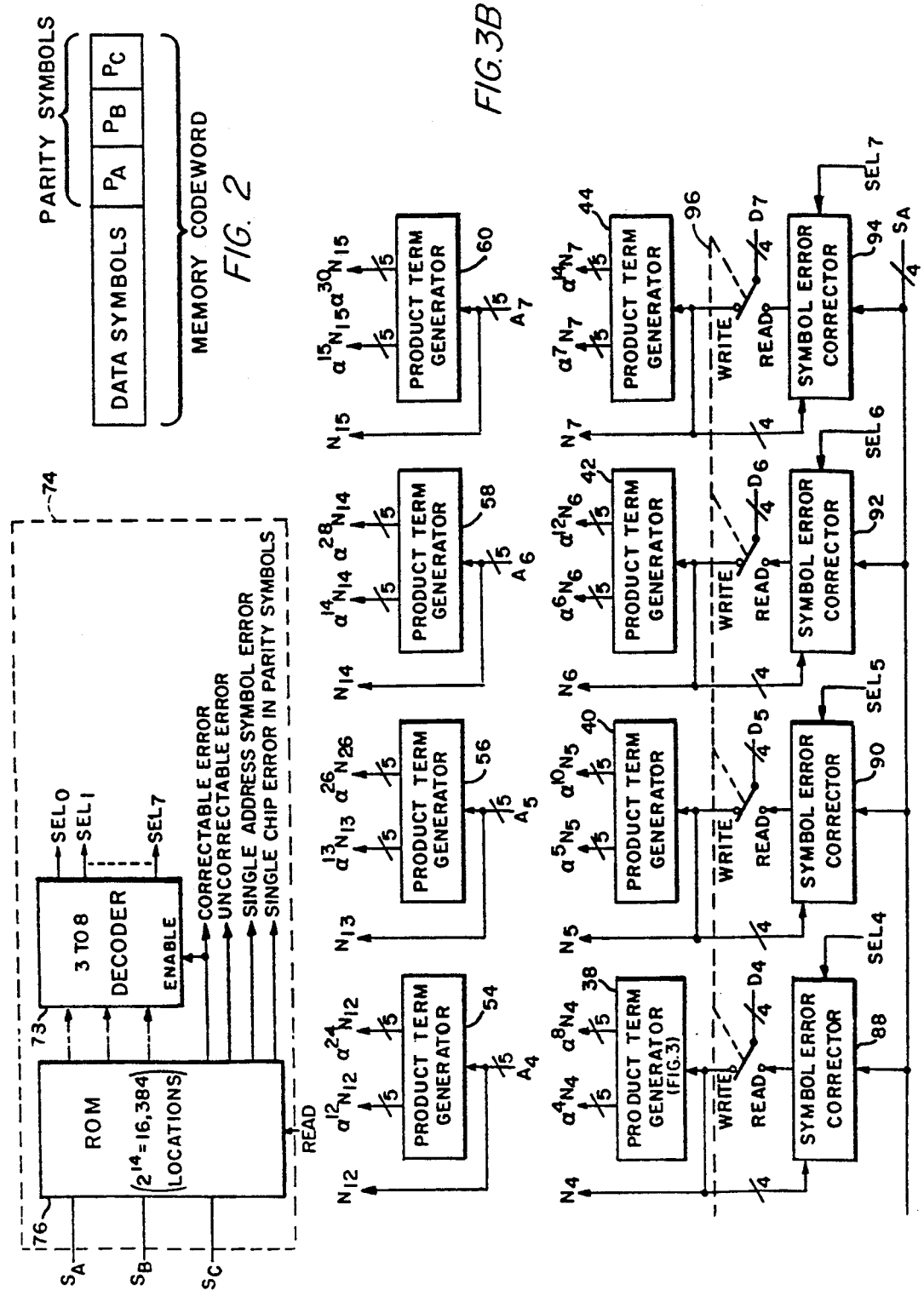

APPARATUS AND METHOD FOR DATA ERROR DETECTION AND CORRECTION AND ADDRESS ERROR DETECTION IN A MEMORY SYSTEM

The Government has rights in this invention pursuant to Contract No. F04701-87-C-0023, awarded by the Department of the Air Force.

BACKGROUND OF THE INVENTION

This invention relates generally to an apparatus and method for performing error detection and correction in a memory system and more particularly to an apparatus and method for performing single symbol correction and double symbol detection (SSC-DSD) of data error and single symbol detection and double symbol detection (SSD-DSD) of addressing errors using a modified Reed Solomon code.

When fault-tolerance is required in memory system architectures, it is necessary to include some type of error coding in the stored information. The error code is required to provide a means of detecting or detecting and correcting errors in the information that are generated from faults incurred by memory data and addressing errors. The primary responsibility of the code is to protect against soft or transient errors. Transient errors in memory are typically orders of magnitude more frequent than errors due to hard or to permanent faults. While the geometries of the memory cells in semiconductor memory devices are designed to minimize the chance of multiple upsets from a single transient event, increasing memory densities and advanced packaging techniques tend to counteract this precaution. This factor, combined with requirements to operate in progressively higher Single Event Upset (SEU) rate environments make the chances of multiple bit errors in a symbol from a single event significant where a symbol comprises multiple bits. Permanent failures of memory devices may take many forms, but the dominant failure mode is the whole-chip-failure where the entire device is lost.

For memory architectures that use "by-one" device organizations (e.g., 256K × 1 chips), the requirements on the code for protecting against multiple failure events are relaxed. Since an error code covers only a word of information at a time, even multiple events in a single device affect only one bit in the codeword. Similarly, whole-chip-failures are seen by the codeword as a single bit error. These requirements can be satisfied by conventional Hamming codes such as the Single Error Correcting-Double Error Detecting (SEC-DED) codes. When memory device organizations are used which are wider than "by-one", conventional Hamming codes can be easily foiled by multiple bit errors in a symbol and whole-chip-failures. For these cases, it is necessary to use a code which detects burst errors up to the width of the device as well as whole-chip-failures. This type of code performance may be better satisfied by a Reed Solomon code.

In U.S. Pat. No. 4,928,280, issued May 22, 1990, to Marlin A. Nielson et al. and assigned to IBM Corporation, it is noted that error correcting cyclic codes have the advantage that they can be simply implemented with shift registers, exclusive-OR gates, and feedback connections. They are based on an underlying algebraic structure that makes analysis simple and aids the design of encoders and decoders. Cyclic codes can be used for corrections of random errors and burst errors and are considered the most popular and the most useful. Cyclic codes that have proved very efficient are the BCH codes, named for their discoverers, Bose, Chaudhari, and Hocguenghem. One of the BCH codes is called the Reed Solomon code.

Nielson et al. further point out that cyclic codes are produced by multiplying the symbols of the source data by a generator polynomial and dividing the received words by the same polynomial. A polynomial is a code vector. If the remainder after division is zero, the received words of the destination data contain no errors. If the remainder is not zero, then an error occurred and the remainder can be used in some cases to correct the errors. If the source data is sent without modification, then the product of the multiplication by the generator polynomial is appended to the end of the source data. These extra symbols are called check symbols. The remainder symbols resulting from division o the destination data by the generator polynomial are called syndromes. If the syndromes are zero-valued, then no error occurred between source and destination.

A Galois Field with $2^m$ symbols, denoted by $GF(2^m)$, are used as coefficients in a Reed Solomon code. In general, there are two coefficients (typically 0 and 1) and an m-degree polynomial, $P(\alpha)$. For $m=5$, $P(\alpha)$ is chosen so that all $2^m - 1$ symbols will be different. So, $P(\alpha) = \alpha^5 + \alpha^2 + 1$.

In U.S. Pat. No. 4,861,193, issued Oct. 2, 1990, to Pierre Debord et al. and assigned to IBM Corporation, an apparatus and method is disclosed for correcting data words from a memory in which coded data is divided into a plurality of multi-bit packages. An error correcting code is employed that is able to correct at least one error in one package having suffered at least one hard failure and correct a single soft error in a different package. In U.S. Pat. No. 4,661,955, issued Apr. 28, 1987, to David L. Arlington et al. and assigned to IBM, Corporation, other examples of package codes are cited along with their hardware implementation.

The detection and correction of hard and soft errors in memories has been concerned with errors in the data words retrieved from such memories; there has been no attempt to detect addressing errors with the error code in addition to the data errors.

In U.S. Pat. No. 4,142,174, issued Feb. 27, 1979, to Chin L. Chen et al., and assigned to IBM Corporation, a high speed decoding scheme for Reed-Solomon codes is disclosed capable of correcting up to three symbol errors in codewords made up of data and check symbols but it does not anticipate the present invention.

In the prior art of error detection and correction it has been necessary to overcome a mismatch of the number of bits needed in the Reed Solomon code symbols (both data and parity symbols) compared to the bit width of a memory chip. In U.S. Pat. No. 4,862,463, issued Aug. 29, 1990, to Chin-Long Chen and assigned to IBM Corporation, an approach to the problem of matching the number of bits in a code symbol to the width of the memory chip is disclosed. In particular, Chen modifies the code to require fewer bits per symbol. However, this approach results in a mapping of bit positions to chips as shown in FIG. 3 of each patent where adjacent bits of a memory word do not map into the same memory chip as is done in the present invention.

SUMMARY OF THE INVENTION

Accordingly, it is therefore an object of this invention to provide detection of memory system addressing errors as well as detecting and correcting data errors.

It is a further object of this invention to provide error detection and correction in a memory system wherein parity symbols based on a modified Reed-Solomon code are generated for a codeword based on data symbols and their corresponding address symbols.

It is a further object of this invention to provide bit padding for implementing portions of an error detection and correction apparatus where the memory chip bit width of a memory array is insufficient to match the number of symbol bits required for providing an adequate symbol width for a Galois Field for a Reed-Solomon code.

The objects are further accomplished by providing an error detection and correction apparatus comprising memory means for storing a codeword including data symbols and parity symbols into a location of the memory means and reading the codeword from the memory means in accordance with a control signal and the address of the codeword location, means for generating the parity symbols of each codeword based on the data symbols and corresponding address symbols of the codeword in accordance with a modified Reed-Solomon code, a first of the parity symbols determines an error value in the data symbols and corresponding address symbols, a second of the parity symbols provides for locating the error value in one of the data and corresponding address symbols, and a third of the parity symbols provides for detecting at least two symbol errors, and means coupled to the parity symbol generating means and the parity symbol outputs of the memory means for generating syndromes, the syndromes providing information to perform error detection and correction of the codeword. Such apparatus performs single data symbol error correction, double data symbol error detection, single address symbol error detection, double address symbol error detection, and single and double error detection in the parity symbols. The error detection and correction apparatus further performs detection of any combination of two errors from said data symbols, address symbols and parity symbols.

The objects are further accomplished by providing an error detection and correction apparatus comprising memory means for storing a codeword including data symbols and parity symbols into a location of the memory means and reading the codeword from the memory means in accordance with a control signal and the address of the codeword location, the address includes a plurality of symbols, means for generating a first ($P_A$) of the parity symbols based on the data symbols and the corresponding address symbols of the codeword in accordance with a modified Reed-Solomon code, where $$P_A = \sum_i N_i,$$

$N_i$ being the data symbols and corresponding address symbols, means for generating a second ($P_B$) of the parity symbols, where $$P_B = \sum_i \alpha^i N_i,$$

$\alpha$ being a primitive element in a Galois Field ($2^m$) where m is the number of bits in the symbols, the $P_B$ providing for locating a single symbol error of the data symbols and symbols of the address, means for generating a third ($P_C$) of the parity symbols, where $$P_C = \sum_i \alpha^{2i} N^i$$

for detecting at least two symbol errors of the data symbols and corresponding address symbols, means coupled to the data symbols and address symbols for generating the $N_i$, $\alpha_i N_i$ and $\alpha^{2i} N_i$ product terms to produce the $P_A$, and $P_B$ and $P_C$ parity symbols in accordance with the Galois Field of $2^m$ elements, and means coupled to the parity symbol generating means and the parity symbol outputs of the memory means for generating syndromes, the syndromes providing information to perform error detection and correction of said codeword. Such apparatus performs single data symbol error correction, double data symbol error detection, single address symbol error detection, double address symbol error detection, and single and double error detection in the parity symbols the error detection and correction apparatus further performs detection of any combination of two errors from the data symbols, address symbols and parity symbols.

The objects are further accomplished by providing an error detection and correction apparatus comprising memory means for storing a codeword including data symbols and parity symbols into a location of the memory means and reading the codeword from the memory means in accordance with a control signal and the address of the codeword location, and means for generating the parity symbols m bits wide for each codeword in accordance with a Reed-Solomon code using q bit symbols for the data symbols and address symbols when m bit symbols are required for the Reed-Solomon code, where m is equal to q +1, and means for padding the data symbols and address symbols with a logic zero in the parity symbol generating means to obtain the q +1 bits of said m bit symbols.

The objects are further accomplished by a method of error detection and correction comprising the steps of storing a codeword including data symbols and parity symbols into a location of the memory means and reading the codeword from the memory means in accordance with a control signal and the address of the codeword location, generating the parity symbols of each codeword based on the data symbols and corresponding address symbols of the codeword in accordance with a modified Reed-Solomon code, a first of the parity symbols provides for determining an error in the data symbols and corresponding address symbols, a second of the parity symbols provides for locating the error in one of the data symbols or corresponding address symbols, and a third of the parity symbols provides for detecting at least two symbol errors, generating syndromes with means coupled to the parity symbol generating means and the parity symbol outputs of the memory means, the syndromes providing information to perform error detection and correction of said codeword. Such method of error detection and correction further includes the steps of performing single data symbol error correction, double data symbol error detection, single address symbol error detection, double address symbol error detection and single and double error detection in the parity symbols. The method of performing error detection and correction of said codeword further includes the step of performing detection of any combination of two errors from said data symbols, address symbols and parity symbols.

BRIEF DESCRIPTION OF THE DRAWINGS

Other and further features and advantages of the invention will become apparent in connection with the accompanying drawings wherein:

FIG. 2 shows a memory codeword comprising data symbols and parity symbols;

DESCRIPTION OF THE PREFERRED EMBODIMENT

Figure 1:
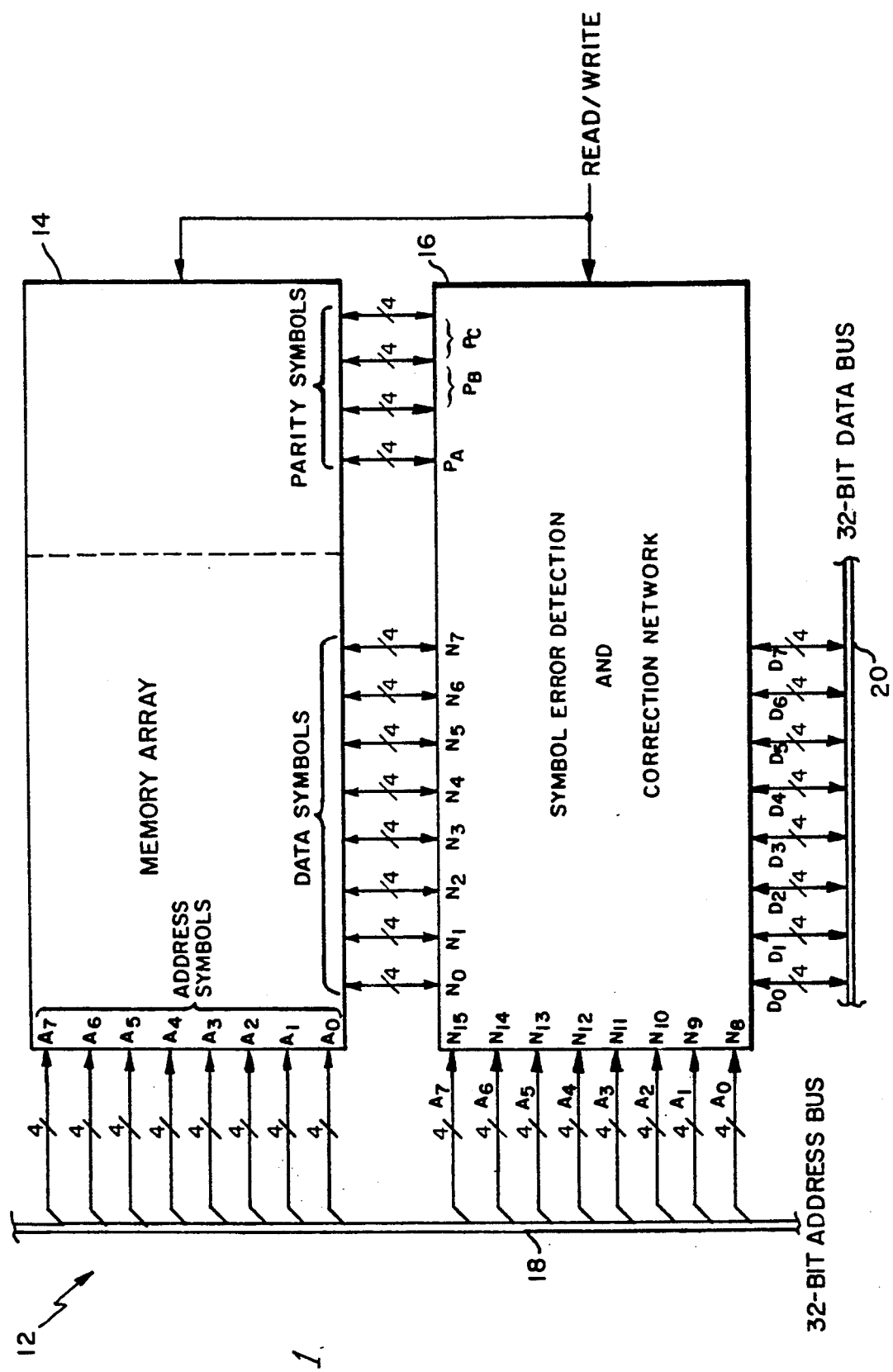
FIG. 1 is a general block diagram of a memory system including an error detection and correction network of the invention employing a modified Reed Solomon code.

Referring to FIG. 1, there is shown a memory system 12 comprising a memory array 14 coupled to a symbol error detection and correction network 16. The memory array 14 is organized to have a 32-bit address by 48-bit input-output comprising 32 bits for data and 16 bits for parity symbols. The memory array 14 comprises a plurality of very large scale integrated (VLSI) circuit memory chips having multiple bits per address. An address bus 18 provides for transferring a 32-bit address to both the memory array 14 and the symbol error detection and correction network 16. A data bus 20 provides for transferring 32-bit data to and from the symbol error detection and correction network 16 of the memory system 12. The error detection and correction network 16 according to the invention performs single symbol correction and double symbol detection (SSC-DSD) of symbol data errors and single symbol detection and double symbol detection (SSD-DSD) of address errors and single and double error detection in the parity symbols using a modified Reed Solomon code; network 16 further performs detection of any combination of at least two errors from the data symbols, address symbols and parity symbols. A symbol is defined as a subset of adjacent bits in a data word or an address word, or in the case of a parity symbol, it comprises adjacent parity bits.

In the present embodiment the multi-bit memory chips are each 4 bits wide, the address width is 32 bits, and the data is 32 bits. The code used to protect the data stored in memory covers not only the 32 data bits but also the 32 address bits. The class of codes selected has the ability to correct symbol errors in a codeword where the codeword is received as a block of m-bit symbols; if an error occurs in any symbol (an error of 1 to m bits), then that symbol may be corrected. The code is derived from the Galois Field $GF(2^m)$ and is able to detect and correct single symbol errors over a codeword of up to $2^m - 1$ symbols. In the present embodiment of 64 information bits (32 address and 32 data) the acceptable smallest symbol size is 5 bits. Thus, the Galois Field is GF(32). To match the needed 5-bit symbol size to the 4-bit memory chip, a fifth logical zero bit is appended to the 4-bit address and data symbols to use $GF(2^5)$.

The Galois Field is generated by taking successive powers of the primitive polynomial of the field which in the case of GF(32) is:

$$\text{Primitive Polynomial} = P(\alpha) = \alpha^5 + \alpha^2 + 1$$

and produces Table 1 showing a representation of the Galois Field of $2^5$ elements. The codeword as shown in FIG. 2 is a modified Reed-Solomon code and comprises the data symbols and three parity symbols $P_A$, $P_B$, and $P_C$ where:

$$P_A = \sum_i N_i \quad P_B = \sum_i \alpha^i N_i \quad P_C = \sum_i \alpha^{2i} N_i$$

where $\alpha$ is a primitive element in $GF(2^m)$ and the $N_i$ are the various data and address symbols. The parity symbols are calculated and stored when a codeword is written to memory. When a codeword is read from memory the parity symbols are recalculated and then added to the stored parity symbols to generate three syndromes, $S_A$, $S_B$ and $S_C$. These syndromes are interpreted as indicated in Table 2.

TABLE 2

| SYNDROME | INDICATION |
| --- | --- |
| $S_A = S_B = S_C = 0$ | No Errors |
| $S_A \neq 0$ and $S_B = \alpha^i S_A$ and $S_C = \alpha^{2i} S_B$ | Error of $S_A$ in $N_i$ |
| $S_A \neq 0$ and $S_B$ and/or $S_C = 00001$ | Error of 00001 in $S_A$ and/or $S_B$ |
| One of $S_A$ or $S_B$ or $S_C \neq 0$ | Error in $S_A$ or $S_B$ or $S_C$ |
| $S_A$, $S_B$ or $S_C$ = other values | Multiple Errors |

Error detection and correction for memory reads of memory system 12 involves syndrome generation, syndrome decoding and data correction (in the case of data symbol errors). The syndrome is the difference pattern between the parity symbols read from memory and the parity symbols calculated from the data read and its corresponding address. If there are no errors, then the codes will compare and the syndrome will be equal to zero as shown in Table 2. If there is an error in a data symbol, it is corrected before being placed on the 32-bit data bus (20) by one of the symbol error correctors 80-94. Typically when an error is found in a single memory chip, whether it be a data error or a syndrome error, the system using the memory will rewrite the whole corrected code word thus avoiding the accumulation of soft errors. When a single address error or multiple errors are found, the system using the memory is informed so that an overall system's recovery strategy may be employed.

Figure 3A:
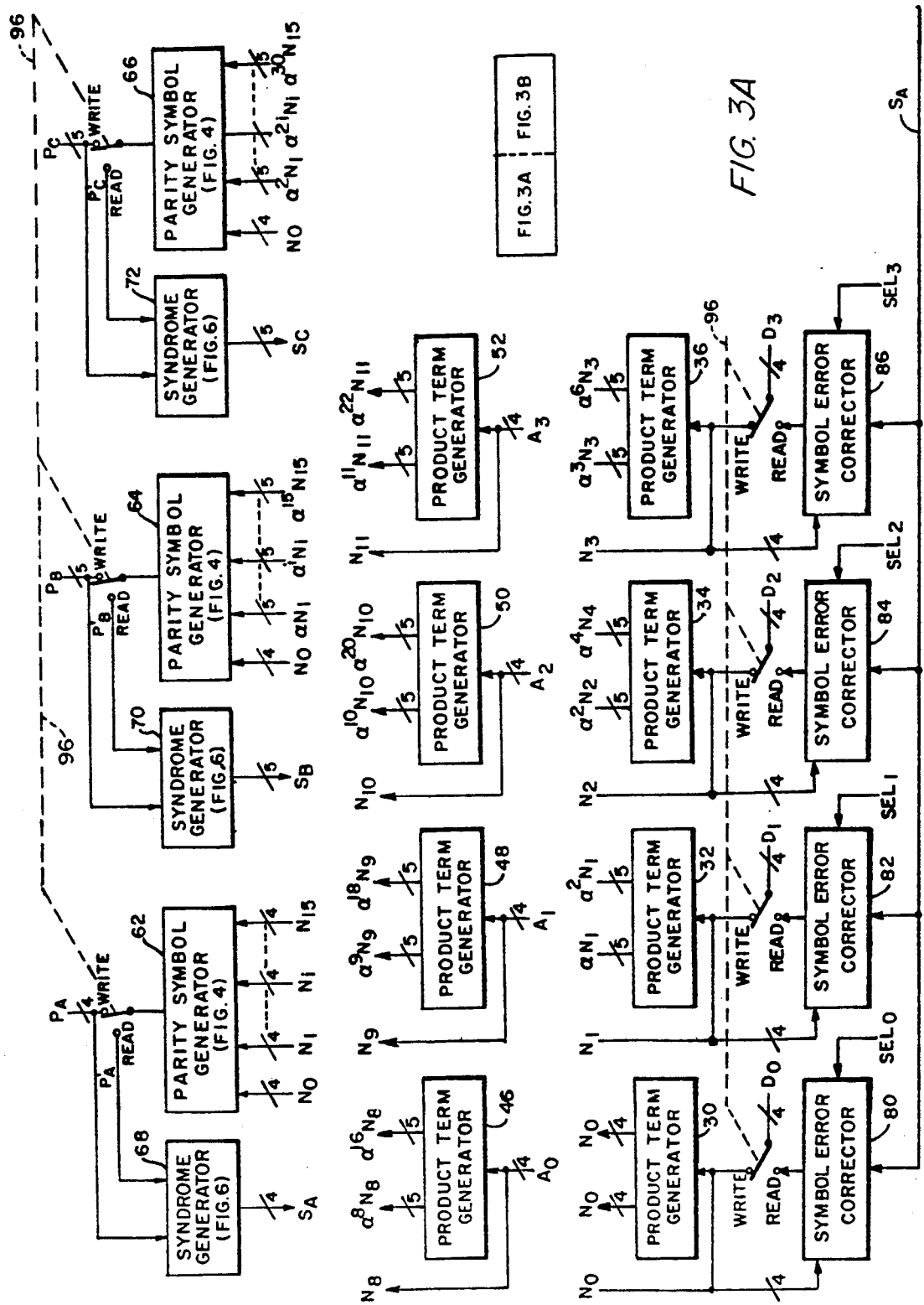
FIG. 3 (formed of FIGS. 3A and 3B together) is a detailed block diagram of the symbol error detection and correction network in the memory system of FIG. 1.

Referring now to FIG. 3 formed of FIGS. 3A and 3B together, there is shown a detail block diagram of the error detection and correction network 16 comprising 16 product term generators 30-60, three parity symbol generators 62, 64, 66, three syndrome generators 68, 70, 72, a syndrome interpreter 74 and eight symbol error correctors 80–94. The 32 data bits in groups of 4 bit symbols each represented by $D_0$–$D_7$ are connected to a read/write switch 96. Although the switch 96 is illustrated here as being implemented by a ganged single pole double throw switch, it typically would be implemented by logic means known to one of ordinary skill in the art. The switch 96 directs the data bits according to whether a read or a write mode is being performed by the memory array 14. When performing a memory write mode the 32 data bits are fed to the product term generators 30–44 and when performing a memory read mode the data bits for memory are fed to the symbol error correctors 80–94. The 32 address bits in groups of 4 bit symbols each represented by $A_0$–$A_7$ are connected to product term generators 46–60 respectively. $A_0$–$A_7$ are also referenced as $N_8$–$N_{15}$ in the symbol error detection and correction network 16.

When in the memory write mode the incoming data symbols $D_0$–$D_7$ from the 32-bit data bus 20 and the address symbols $A_0$–$A_7$ from the 32-bit address bus 18 are fed to the 16 product term generators 30–60 to product the $\alpha^i N_i$ and $\alpha^{2i} N_i$ terms according to entries in Table 3 which are used to calculate the parity symbols $P_B$ and $P_C$. The parity symbol generators 62, 64, 66 receive the appropriate $N_i$, $\alpha^i N_i$ and $\alpha^{2i} N_i$ terms respectively according to the entries in Table 3 for generating the $P_A$, $P_B$ and $P_C$ parity symbols as previously defined. $P_A$ generated by the parity symbol generator 62 is used to determine a value of a single symbol error, if any, by adding modulo 2 (exclusive-OR) the corresponding bits of each symbol over the data word and its corresponding address; $P_B$ generated by the parity symbol generator 64 computes a sum of the $\alpha^i$ weighted symbols for locating a single error; and $P_C$ generated by the parity symbol generator 66 generates a sum of $\alpha^{2i}$ weighted symbols for detecting at least two errors. Each parity symbol is stored in memory array 14.

When in the memory read mode the address symbols $A_0$–$A_7$ are used to calculate the product terms in the same manner as in the memory write mode. However, the $N_0$–$N_7$ data symbols from the memory array 14 replace the $D_0$–$D_7$ symbol inputs to the product term generators 30–44 for determining the read mode $\alpha^i N_i$ and $\alpha^{2i} N_i$ terms which are fed to the parity symbol generators 62, 64, 66 for generating new parity symbols $P_A'$, $P_B'$ and $P_C'$. These new read parity symbols are used with the parity symbols $P_A$, $P_B$, $P_C$ being read out of the memory array to calculate by adding modulo 2 the corresponding bit of each symbol in the syndrome generators 68, 70, 72 the three syndromes $S_A$, $S_B$ and $S_C$.

The three syndromes $S_A$, $S_B$ and $S_C$ are used to determine if there is an error and what corrective action, if any, to take in the event of an error. The rules for interpreting $S_A$, $S_B$ and $S_C$ are listed in Table 2. The three syndromes comprise a total of 14 bits which are used to address a ROM 76 of syndrome interpreter 74 which has 16,384 storage locations. The ROM 76 has seven outputs wherein three of the outputs are decoded to generate select signals to point to a data symbol error and the other four outputs indicate whether an error is correctable or uncorrectable, or a single address symbol error, or a single chip error in parity symbols. The correctable error output enables a 3 line to 8 line decoder 78 which provides SEL0 to SEL7 outputs each of which is fed to an input of the symbol error corrector 80–94 respectively. When a correctable data symbol error occurs in position "i" during a memory read mode, $S_A$ is added to the incorrectly read data symbol by the ith symbol error corrector. The other symbol error correctors pass the read data through to the data bus 20.

Figure 4:
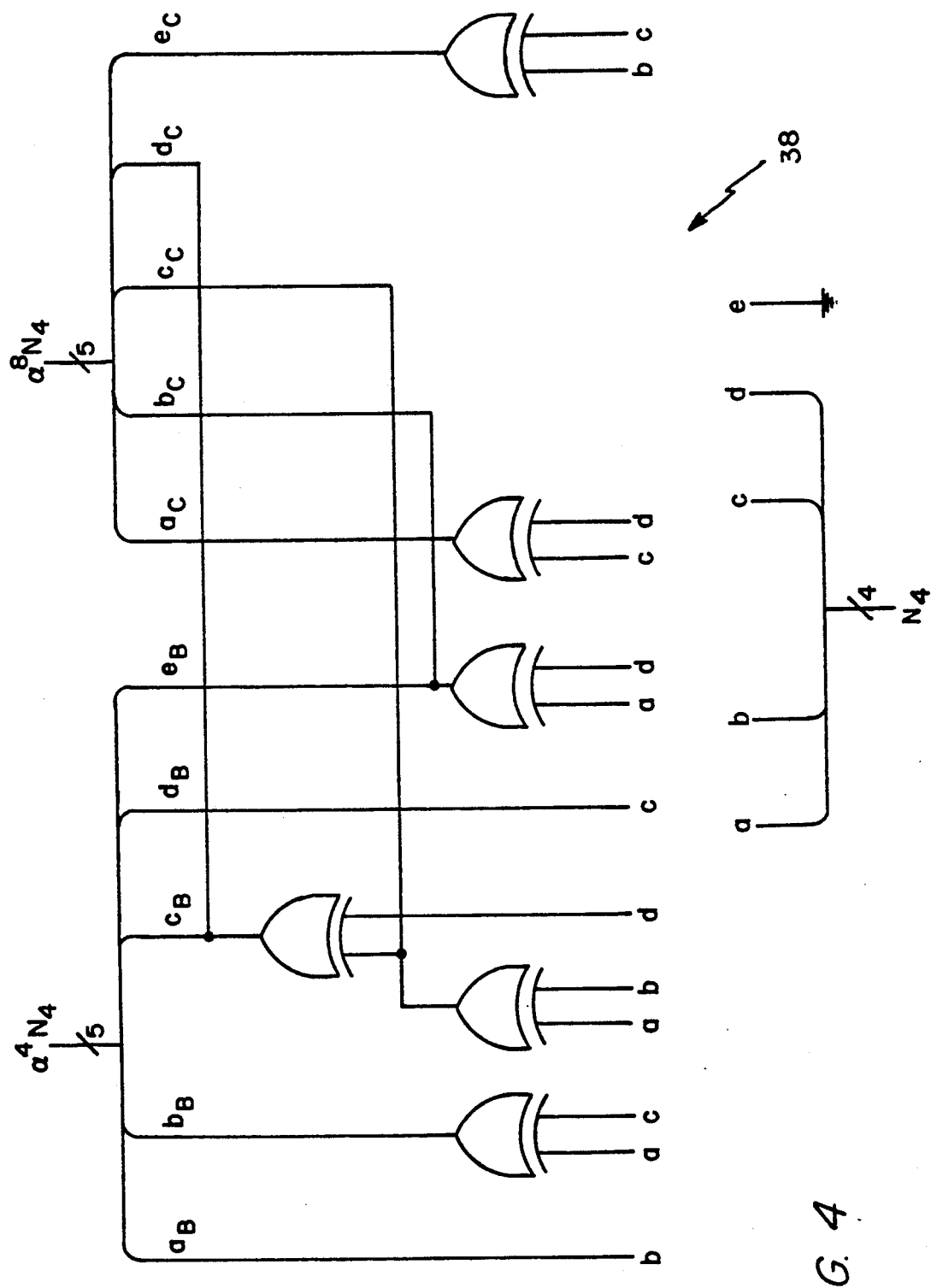
FIG. 4 is a logic diagram of a product term generator of FIG. 3.

Referring now to FIG. 4, a logic diagram of the product term generator 38 is shown which generates the terms $\alpha^4 N_4$ and $\alpha^8 N_4$, and the logic of this generator 38 is representative of the logic required for the other product term generators 30–36 and 40–60. The four $N_4$ symbol data bits are labeled a, b, c and d and a fifth signal labeled "e" is a padded right most bit which is a hard-wired logical zero. This padded bit "e" allows for calculating the terms $\alpha^4 N_4$ and $\alpha^8 N_4$ without the need for storing a fifth bit for each data symbol. Hence, padding or adding a logical zero bit allows for matching the number of bits needed in the Reed Solomon code symbols (both data and parity symbols) to the bit width of the memory chip in memory array 14. Likewise for address symbols, the hardware padded logical 0 for the fifth bit allows for calculating $\alpha^i N_i$ and $\alpha^{2i} N_i$ terms for the Galois Field $GF(2^5)$ while only having four actual bits in the symbol $N_i$. This padding technique does not affect the operation of the memory array 14 since each information symbol occupies only 4 bits.

Figure 5:
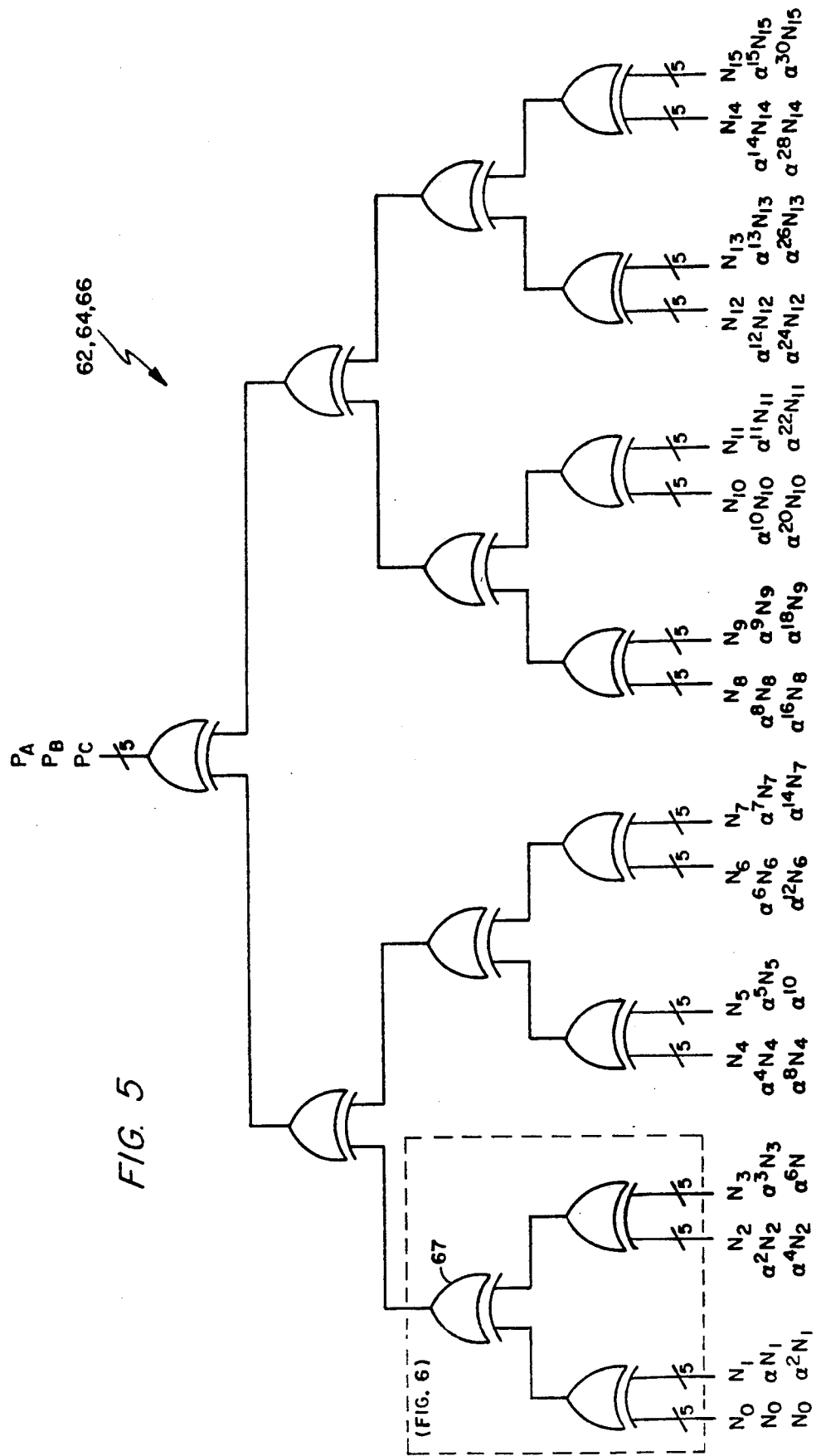
FIG. 5 is a diagram representative of the logic for implementing parity symbol generators $P_A$, $P_B$ and $P_C$.
Figure 6:
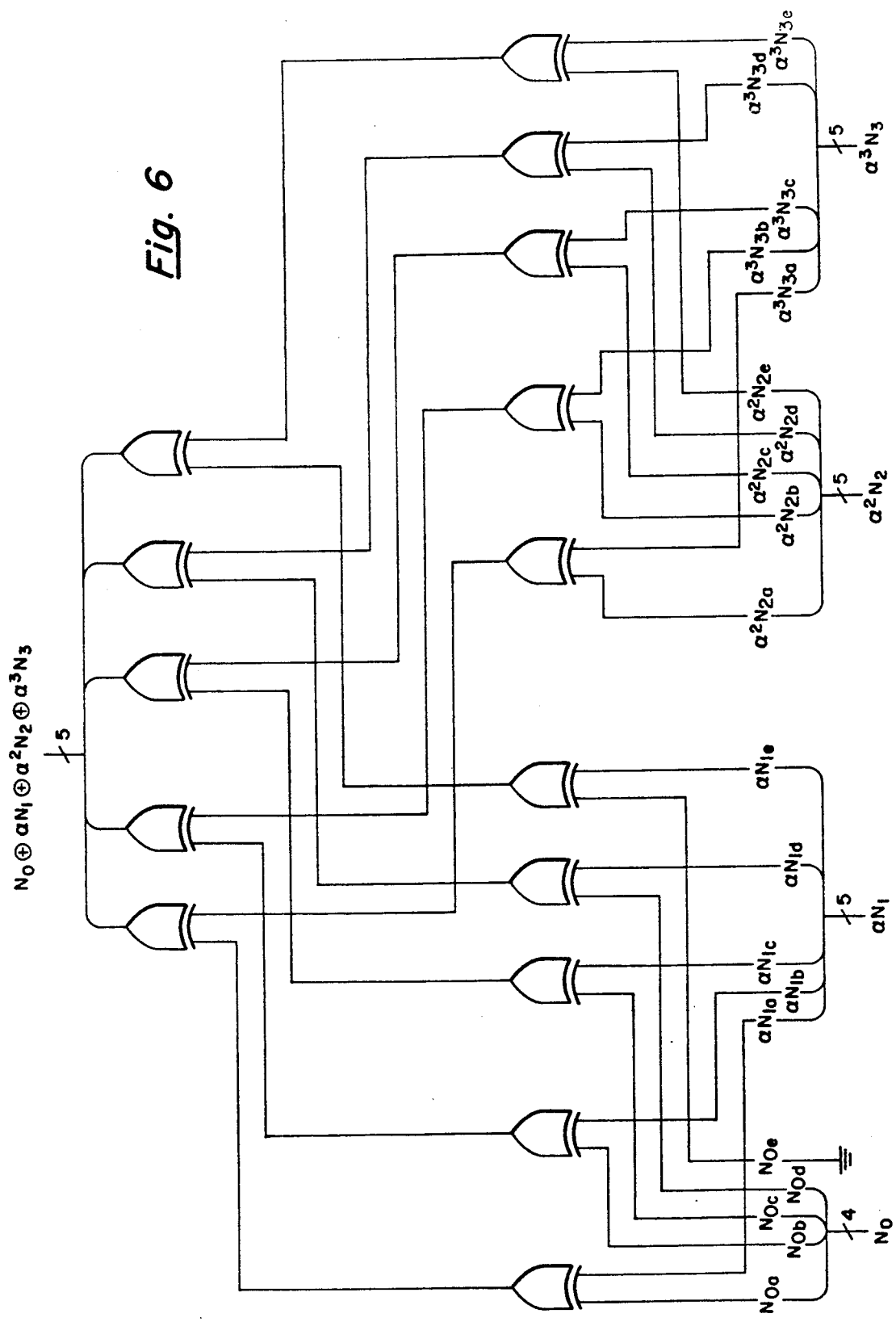
FIG. 6 is a logic diagram for generating a portion of the product terms for determining parity symbol $P_B$.

Referring now to FIG. 5 and FIG. 6, FIG. 5 is a diagram representative of the logic to generate the parity symbol generators 62, 64, 66 of FIG. 3A showing a plurality of exclusive-OR gates for generating the parity symbols $P_A$, $P_B$ and $P_C$ respectively. Each of the three parity symbol generators comprises similar exclusive-OR gate structure shown in FIG. 5. The first row of inputs $N_0$ to $N_{15}$ into generator 62 produces $P_A$; the second row of inputs ($N_0$, $\alpha N_1$) to ($\alpha^{14} N_{14}$, $\alpha^{15} N_{15}$) into generator 64 produces $P_B$; and the third row of inputs ($N_0$, $\alpha^2 N_1$) to ($\alpha^{28} N_{14}$, $\alpha^{30} N_{15}$) into generator 66 produces $P_C$. FIG. 6 shows the detail exclusive-OR logic for product terms $N_0$, $\alpha N_1$, $\alpha^2 N_2$ and $\alpha^3 N_3$ which is used to generate a portion of the terms of $$P_B = \sum_i \alpha^i N_i.$$

This logic generates at the output of exclusive-OR gate 67 in FIG. 5 the first four product terms of $P_B$ which are $N_0 \oplus \alpha N_1 \oplus \alpha^2 N_2 \oplus \alpha^3 N_3$. The remaining logic in FIG. 5 generates the rest of the product terms and such logic is known to one of ordinary skill in the art. Similar exclusive-OR logic gates are used to generate $P_A$ and $P_C$ where $$P_A = \sum_i N_i \quad \text{and} \quad P_C = \sum_i \alpha^{2i} N_i.$$

Figure 7:
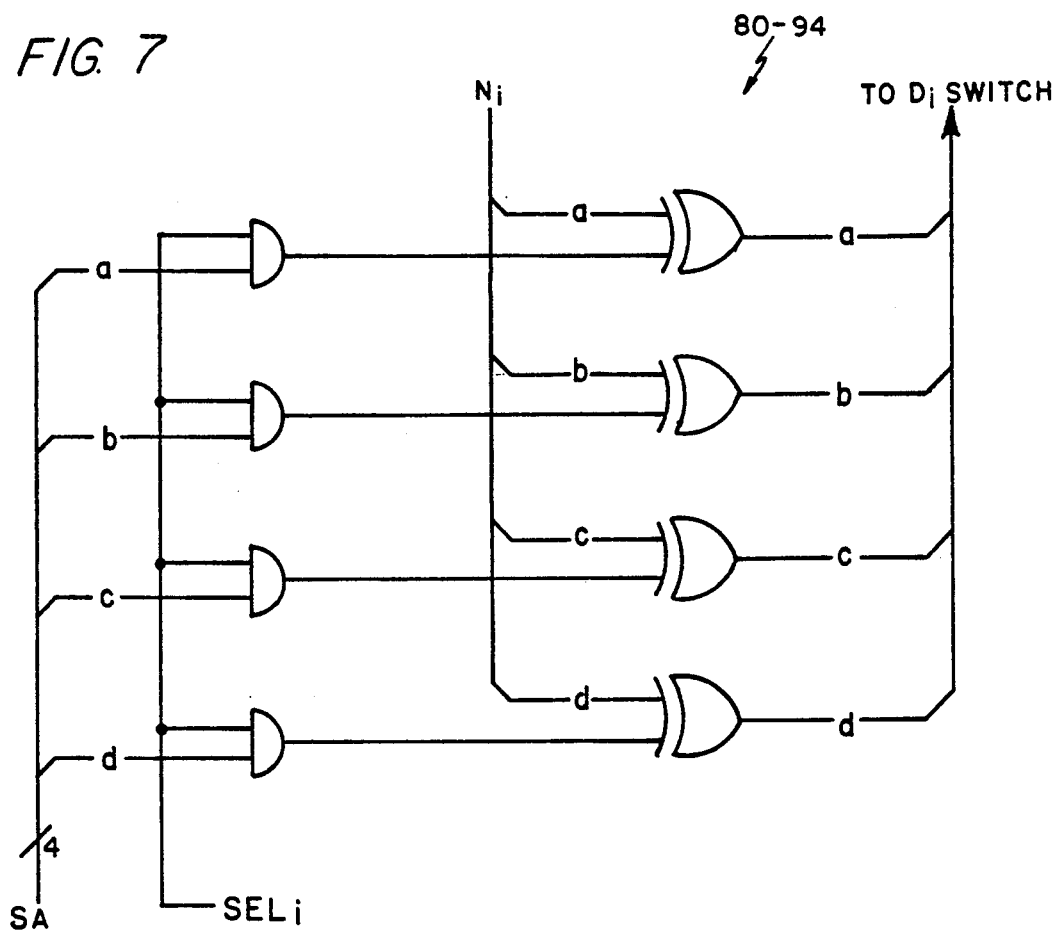
FIG. 7 is a logic diagram of a symbol error corrector.

Referring now to FIG. 7, a logic diagram for each of the symbol error correctors 80–94 of FIG. 3 is shown. $S_A$, which is one of the three syndromes, is coupled to each symbol error corrector 80–94. When a correctable data symbol error occurs in position "i" during a memory read mode, $S_A$ is added to the incorrectly read data symbol by the ith symbol generator. The SEL0 to SEL7 signals generated by the syndrome interpreter 74 select the ith symbol error corrector for said addition to occur. Otherwise, the symbol error correctors 80–94 pass the memory read data directly through to the data bus 20 via the switch 96.

Figure 8:
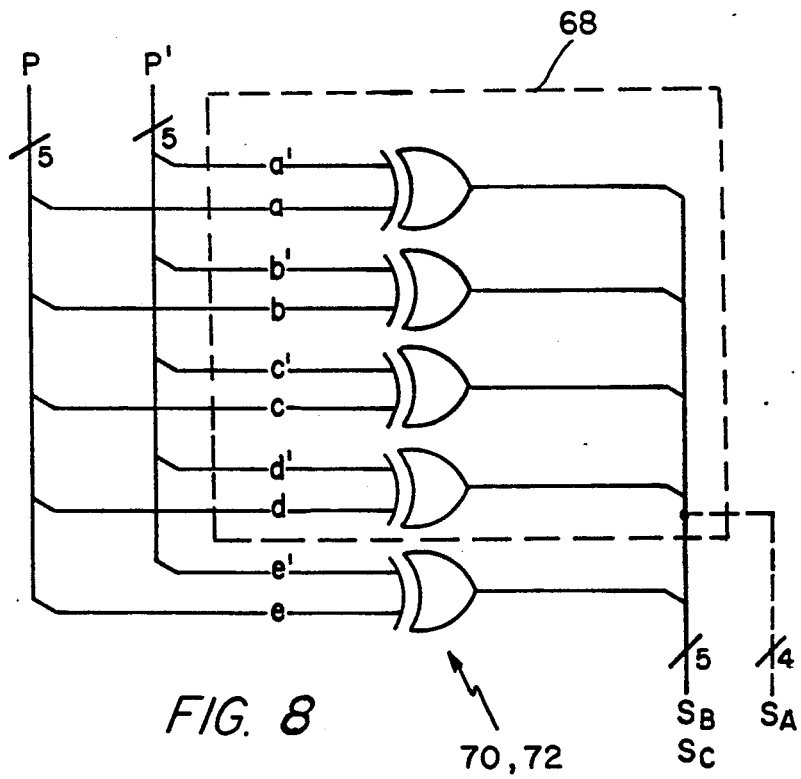
FIG. 8 is a logic diagram of a syndrome generator.

Referring now to FIG. 8, a logic diagram of the syndrome generators 68, 70, 72 is shown comprising a plurality of exclusive-OR gates. The syndrome generator 68 does not have the "e" lines, hence, $S_A$ comprises four signals. The syndrome generators 70, 72 for generating $S_B$ and $S_C$ have five signals. The syndrome generators 68, 70, 72 are used to determine if there is a difference pattern between the parity symbols read from memory and the parity symbols calculated from the data read and its corresponding address The $S_A$, $S_B$ and $S_C$ outputs from the syndrome generators 68, 70, 72 are fed to the ROM 76 of the syndrome interpreter 74 shown in FIG. 3 and described hereinbefore.

This concludes the description of the preferred embodiment. However, many modifications and alterations will be obvious to one of ordinary skill in the art without departing from the spirit and scope of the inventive concept. Therefore, it is intended that the scope of this invention be limited only by the appended claims.

TABLE 1

| | | | | | | | | $\alpha^4$ | $\alpha^3$ | $\alpha^2$ | $\alpha^1$ | $\alpha^0$ |
|---|---|---|---|---|---|---|---|---|---|---|---|---|
| 0 | = | | | | | | | 0 | 0 | 0 | 0 | 0 |
| $\alpha^0$ | = | | | | | | 1 = | 0 | 0 | 0 | 0 | 1 |
| $\alpha^2$ | = | | | | $\alpha$ | | = | 0 | 0 | 0 | 1 | 0 |
| $\alpha^2$ | = | | | $\alpha^2$ | | | = | 0 | 0 | 1 | 0 | 0 |
| $\alpha^3$ | = | | $\alpha^3$ | | | | = | 0 | 1 | 0 | 0 | 0 |
| $\alpha^4$ | = | $\alpha^4$ | | | | | = | 1 | 0 | 0 | 0 | 0 |
| $\alpha^5$ | = | | | $\alpha^2$ | | + 1 | = | 0 | 0 | 1 | 0 | 1 |
| $\alpha^6$ | = | | $\alpha^3$ | | + $\alpha$ | | = | 0 | 1 | 0 | 1 | 0 |
| $\alpha^7$ | = | $\alpha^4$ | | + $\alpha^2$ + | | | = | 1 | 0 | 1 | 0 | 0 |
| $\alpha^8$ | = | | $\alpha^3$ | + $\alpha^2$ + | | 1 | = | 0 | 1 | 1 | 0 | 1 |
| $\alpha^9$ | = | $\alpha^4$ + | $\alpha^3$ | | + $\alpha$ | | = | 1 | 1 | 0 | 1 | 0 |
| $\alpha^{10}$ | = | $\alpha^4$ | | | | + 1 | = | 1 | 0 | 0 | 0 | 1 |
| $\alpha^{11}$ | = | | | $\alpha^2$ + | $\alpha$ + | 1 | = | 0 | 0 | 1 | 1 | 1 |
| $\alpha^{12}$ | = | | $\alpha^3$ + | $\alpha^2$ + | $\alpha$ | | = | 0 | 1 | 1 | 1 | 0 |
| $\alpha^{13}$ | = | $\alpha^4$ + | $\alpha^3$ + | $\alpha^2$ | | | = | 1 | 1 | 1 | 0 | 0 |
| $\alpha^{14}$ | = | $\alpha^4$ + | $\alpha^3$ + | $\alpha^2$ + | | 1 | = | 1 | 1 | 1 | 0 | 1 |
| $\alpha^{15}$ | = | $\alpha^4$ + | $\alpha^3$ + | $\alpha^2$ + | $\alpha$ + | 1 | = | 1 | 1 | 1 | 1 | 1 |
| $\alpha^{16}$ | = | $\alpha^4$ + | $\alpha^3$ | | + $\alpha$ + | 1 | = | 1 | 1 | 0 | 1 | 1 |
| $\alpha^{17}$ | = | $\alpha^4$ | | | + $\alpha$ + | 1 | = | 1 | 0 | 0 | 1 | 1 |
| $\alpha^{18}$ | = | | | | $\alpha$ + | 1 | = | 0 | 0 | 0 | 1 | 1 |
| $\alpha^{19}$ | = | | | $\alpha^2$ + | $\alpha$ | | = | 0 | 0 | 1 | 1 | 0 |
| $\alpha^{20}$ | = | | $\alpha^3$ + | $\alpha^2$ | | | = | 0 | 1 | 1 | 0 | 0 |
| $\alpha^{21}$ | = | $\alpha^4$ + | $\alpha^3$ | | | | = | 1 | 1 | 0 | 0 | 0 |
| $\alpha^{22}$ | = | $\alpha^4$ | | + $\alpha^2$ + | | 1 | = | 1 | 0 | 1 | 0 | 1 |
| $\alpha^{23}$ | = | | $\alpha^3$ + | $\alpha^2$ + | $\alpha$ + | 1 | = | 0 | 1 | 1 | 1 | 1 |
| $\alpha^{24}$ | = | $\alpha^4$ + | $\alpha^3$ + | $\alpha^2$ + | $\alpha$ | | = | 1 | 1 | 1 | 1 | 0 |
| $\alpha^{25}$ | = | $\alpha^4$ + | $\alpha^3$ | | + | 1 | = | 1 | 1 | 0 | 0 | 1 |
| $\alpha^{26}$ | = | $\alpha^4$ + | | $\alpha^2$ + | $\alpha$ + | 1 | = | 1 | 0 | 1 | 1 | 1 |
| $\alpha^{27}$ | = | | $\alpha^3$ | | + $\alpha$ + | 1 | = | 0 | 1 | 0 | 1 | 1 |
| $\alpha^{28}$ | = | $\alpha^4$ | | + $\alpha^2$ + | $\alpha$ | | = | 1 | 0 | 1 | 1 | 0 |
| $\alpha^{29}$ | = | | $\alpha^3$ | | + | 1 | = | 0 | 1 | 0 | 0 | 1 |
| $\alpha^{30}$ | = | $\alpha^4$ | | | + $\alpha$ | | = | 1 | 0 | 0 | 1 | 0 |
| $\alpha^{31}$ | = | | | | | 1 | = | $\alpha^0$ | | | | |

NOTE: + REPRESENTS MODULO 2 ADDITION

TABLE 3

| | $\alpha^4$ | $\alpha^3$ | $\alpha^2$ | $\alpha^1$ | $\alpha^0$ | | | | | | |
|---|---|---|---|---|---|---|---|---|---|---|---|
| 0 | 0 | 0 | 0 | 0 | 0 | | | | | | |
| $\alpha^0$ | 0 | 0 | 0 | 0 | 1 | $N=N\alpha^0$ | a | b | c | d | e |
| $\alpha^1$ | 0 | 0 | 0 | 1 | 0 | $N\alpha^1$ | b | c | a+d | e | a |
| $\alpha^2$ | 0 | 0 | 1 | 0 | 0 | $N\alpha^2$ | c | a+d | b+e | a | b |
| $\alpha^3$ | 0 | 1 | 0 | 0 | 0 | $N\alpha^3$ | a+d | b+e | a+c | b | c |
| $\alpha^4$ | 1 | 0 | 0 | 0 | 0 | $N\alpha^4$ | b+e | a+c | a+b+d | c | a+d |
| $\alpha^5$ | 0 | 0 | 1 | 0 | 1 | $N\alpha^5$ | a+c | a+b+d | b+c+e | a+d | b+e |
| $\alpha^6$ | 0 | 1 | 0 | 1 | 0 | $N\alpha^6$ | a+b+d | b+c+e | c+d | b+e | a+c |
| $\alpha^7$ | 1 | 0 | 1 | 0 | 0 | $N\alpha^7$ | b+c+e | c+d | a+d+e | a+c | a+b+d |
| $\alpha^8$ | 0 | 1 | 1 | 0 | 1 | $N\alpha^8$ | c+d | a+d+e | a+b+e | a+b+d | b+c+e |
| $\alpha^9$ | 1 | 1 | 0 | 1 | 0 | $N\alpha^9$ | a+d+e | a+b+e | a+b+c | b+c+e | c+d |
| $\alpha^{10}$ | 1 | 0 | 0 | 0 | 1 | $N\alpha^{10}$ | a+b+e | a+b+c | a+b+c+d | c+d | a+d+e |
| $\alpha^{11}$ | 0 | 0 | 1 | 1 | 1 | $N\alpha^{11}$ | a+b+c | a+b+c+d | a+b+c+d+e | a+d+e | a+b+e |
| $\alpha^{12}$ | 0 | 1 | 1 | 1 | 0 | $N\alpha^{12}$ | a+b+c+d | a+b+c+d+e | b+c+d+e | a+b+e | a+b+c |
| $\alpha^{13}$ | 1 | 1 | 1 | 0 | 0 | $N\alpha^{13}$ | a+b+c+d+e | b+c+d+e | c+d+e | a+b+c | a+b+c+d |
| $\alpha^{14}$ | 1 | 1 | 1 | 0 | 1 | $N\alpha^{14}$ | b+c+d+e | c+d+e | d+e | a+b+c+d | a+b+c+d+e |
| $\alpha^{15}$ | 1 | 1 | 1 | 1 | 1 | $N\alpha^{15}$ | c+d+e | d+e | a+e | a+b+c+d+e | b+c+d+e |
| $\alpha^{16}$ | 1 | 1 | 0 | 1 | 1 | $N\alpha^{16}$ | d+e | a+e | a+b | b+c+d+e | c+d+e |
| $\alpha^{17}$ | 1 | 0 | 0 | 1 | 1 | $N\alpha^{17}$ | a+e | a+b | b+c | c+d+e | d+e |
| $\alpha^{18}$ | 0 | 0 | 0 | 1 | 1 | $N\alpha^{18}$ | a+b | b+c | a+c+d | d+e | a+e |
| $\alpha^{19}$ | 0 | 0 | 1 | 1 | 0 | $N\alpha^{19}$ | b+c | a+c+d | a+b+d+e | a+e | a+b |
| $\alpha^{20}$ | 0 | 1 | 1 | 0 | 0 | $N\alpha^{20}$ | a+c+d | a+b+d+e | a+b+c+e | a+b | b+c |
| $\alpha^{21}$ | 1 | 1 | 0 | 0 | 0 | $N\alpha^{21}$ | a+b+d+e | a+b+c+e | b+c+d | b+c | a+c+d |
| $\alpha^{22}$ | 1 | 0 | 1 | 0 | 1 | $N\alpha^{22}$ | a+b+c+e | b+c+d | a+c+d+e | a+c+d | a+b+d+e |
| $\alpha^{23}$ | 0 | 1 | 1 | 1 | 1 | $N\alpha^{23}$ | b+c+d | a+c+d+e | b+d+e | a+b+d+e | a+b+c+e |
| $\alpha^{24}$ | 1 | 1 | 1 | 1 | 0 | $N\alpha^{24}$ | a+c+d+e | b+d+e | a+c+e | a+b+c+e | b+c+d |
| $\alpha^{25}$ | 1 | 1 | 0 | 0 | 1 | $N\alpha^{25}$ | b+d+e | a+c+e | b+d | b+c+d | a+c+d+e |
| $\alpha^{26}$ | 1 | 0 | 1 | 1 | 1 | $N\alpha^{26}$ | a+c+e | b+d | c+e | a+c+d+e | b+d+e |
| $\alpha^{27}$ | 0 | 1 | 0 | 1 | 1 | $N\alpha^{27}$ | b+d | c+e | d | b+d+e | a+c+e |

TABLE 3-continued

| | $\alpha^4$ | $\alpha^3$ | $\alpha^2$ | $\alpha^1$ | $\alpha^0$ | | | | | | |
|---|---|---|---|---|---|---|---|---|---|---|---|
| $\alpha^{28}$ | 1 | 0 | 1 | 1 | 0 | $N\alpha^{28}$ | c+e | d | e | a+c+e | b+d |
| $\alpha^{29}$ | 0 | 1 | 0 | 0 | 1 | $N\alpha^{29}$ | d | e | a | b+d | c+e |
| $\alpha^{30}$ | 1 | 0 | 0 | 1 | 0 | $N\alpha^{30}$ | e | a | b | c+e | d |
| $\alpha^{31}$ | 0 | 0 | 0 | 0 | 1 | $N\alpha^{31}$ | a | b | c | d | e |

NOTE: + REPRESENTS MODULO 2 ADDITION

What is claimed is:

1. A combination for detecting errors and providing correction information comprising:

memory means for storing a codeword, including data symbols and parity symbols each of said symbols having multiple bits, into a location of said memory means and reading said codeword from said memory means in accordance with a control signal and an address of said codeword location;

means for generating said parity symbols of each codeword based on said data symbols and corresponding address symbols of said codeword in accordance with a modified Reed-Solomon code, a first of said parity symbols determines an error value in said data symbols and corresponding address symbols, a second of said parity symbols provides for locating said error value in one of said data symbols and said corresponding address symbols, and a third of said parity symbols provides for detecting at least two symbol errors; and means coupled to said parity symbol generating means and said parity symbol outputs of said memory means for generating syndromes, said syndromes providing information to perform error detection and correction of said codeword.

2. The combination as recited in claim 1 wherein:
said control signal causes said memory means to perform a write mode for storing said codeword or a read mode for reading said codeword.

3. The combination as recited in claim 2 wherein:
said parity symbols generating means generates said parity symbols for said data symbols and corresponding address symbols when said memory means is performing said write mode and when said memory means is performing said read mode.

4. The combination as recited in claim 1 wherein:
said parity symbol outputs from said memory means to said syndrome generating means when reading said codeword are compared to a second set of parity symbols, generated by said parity symbol generator means based on said data symbols being read and said corresponding address symbols, for determining a difference pattern for said error detection and correction of said codeword.

5. The combination as recited in claim 1 wherein:
said syndrome generating means comprises means for generating a plurality of syndrome signals; and
means coupled to said syndrome signals for interpreting said syndrome signals to identify a data symbol error and whether said data symbol error is correctable.

6. The combination as recited in claim 5 wherein:
said interpreting means further comprises means for generating select signals to enable correction of said data symbol error.

7. The combination as recited in claim 5 wherein:
said combination comprises means coupled to data symbols read from said memory means and one of said syndrome signals for performing symbol error correction in accordance with a select signal from said interpreting means.

8. The combination as recited in claim 1 wherein:
said combination performs single data symbol error correction, double data symbol error detection, single address symbol error detection, double address symbol error detection, and single and double error detection in said parity symbols.

9. The combination as recited in claim 8 wherein:
said apparatus further performs detection of any combination of two errors from said data symbols, address symbols and parity symbols.

10. An error detection and correction apparatus comprising:

memory means for storing a codeword including data symbols and parity symbols into a location of said memory means and reading said codeword from said memory means in accordance with a control signal and an address of said codeword location, said address includes a plurality of symbols;

means for generating a first ($P_A$) of said parity symbols based on said data symbols and said corresponding address symbols of said codeword in accordance with a modified Reed-Solomon code for determining an error value in said data symbols and corresponding address symbols, where $$P_A = \sum_i N_i,$$

$N_i$ being said data symbols and corresponding address symbols;

means for generating a second ($P_B$) of said parity symbols, where $$P_B = \sum_i \alpha^i N_i,$$

$\alpha$ being a primitive element in a Galois Field ($2^m$) where m is the number of bits in said symbols, said $P_B$ providing for locating a single symbol error of said data symbols and symbols of said address;

means for generating a third ($P_C$) of said parity symbols, where $$P_i = \sum_i \alpha^{2i} N_i$$

for detecting at least two symbol errors of said data symbols and corresponding address symbols;

means coupled to said data symbols and address symbols for generating said $N_i$, $\alpha_i N_i$ and $\alpha^{2i} N_i$ product terms to produce said $P_A$, $P_B$ and $P_C$ parity symbols in accordance with said Galois Field of $2^m$ elements;

means coupled to said parity symbol generating means and said parity symbol outputs of said memory means for generating syndromes; and means coupled to said syndromes generating means for performing error correction.

11. The error detection and correction apparatus as recited in claim 10 wherein:
said control signal causes said memory means to perform a write mode for storing said codeword or a read mode for reading said codeword.

12. The error detection and correction apparatus as recited in claim 11 wherein:
said parity symbols generating means generates said $P_A$, $P_B$ and $P_C$ parity symbols for said data symbols and corresponding address symbols when said memory means is performing said write mode and when said memory means is performing said read mode generates $P_A'$, $P_B'$ and $P_C'$ parity symbols.

13. The error detection and correction apparatus as recited in claim 12 wherein:
said parity symbol outputs $P_A$, $P_B$ and $P_C$ from said memory means to said syndrome generating means when reading said codeword are compared to said parity symbols $P_A'$, $P_B'$ and $P_C'$, generated by said parity symbol generator means based on said data symbols being read and said corresponding address symbols, for determining a difference pattern for said error detection and correction.

14. The error detection and correction apparatus as recited in claim 10 wherein:
said product terms generating means comprises means for adding a padded bit to a data symbol input and an address symbol input for matching the number of symbol bits to the bit width of a memory ship in said memory means.

15. The error detection and correction apparatus as recited in claim 10 wherein:
said syndrome generating means comprises means for generating a plurality of syndrome signals; and
said error correction means comprises means coupled to said syndrome signals for interpreting said syndrome signals to identify a data symbol error and whether said data symbol error is correctable.

16. The error detection and correction apparatus as recited in claim 15 wherein:
said interpreting means further comprises means for generating select signals to enable correction of said data symbol error.

17. The error detection and correction apparatus as recited in claim 15 wherein:
said apparatus comprises means coupled to data symbols read from said memory means and one of said syndrome signals for performing symbol error correction in accordance with a select signal from said interpreting means.

18. The error detection and correction apparatus as recited in claim 10 wherein:
said error detection and correction apparatus performs single data symbol error correction, double data symbol error detection, single address symbol error detection, double address symbol error detection, and single and double error detection in said parity symbols.

19. The error detection and correction apparatus as recited in claim 18 wherein:
said apparatus further performs detection of any combination of two errors from said data symbols, address symbols and parity symbols.

20. A method of detecting errors and providing correcting information comprising the steps of:

storing a codeword, including data symbols and parity symbols each of said symbols having multiple bits, into a location of a memory means and reading said codeword from said memory means in accordance with a control signal and an address of said codeword location;
generating said parity symbols of each codeword based on said data symbols and corresponding address symbols of said codeword in accordance with a modified Reed-Solomon code, a first of said parity symbols provides for determining an error in said data symbols and corresponding address symbols, a second of said parity symbols provides for locating said error in one of said data symbols or corresponding address symbols, and a third of said parity symbols provides for detecting at least two symbol errors; and
generating syndromes with means coupled to said parity symbol generating means and said parity symbol outputs of said memory means, said syndromes providing information to perform error detection and correction of said codeword.

21. The method as recited in claim 20 wherein:
said step of generating syndromes to perform error detection and correction of said codeword includes single data symbol error correction, double data symbol error detection, single address symbol error detection and double address symbol error detection.

22. A method of error detection and correction comprising the steps of:
storing a codeword including data symbols and parity symbols into a location of a memory means and reading said codeword from said memory means in accordance with a control signal and an address of said codeword location, said address includes a plurality of symbols;
generating a first ($P_A$) of said parity symbols based on said data symbols and said corresponding address symbols of said codeword in accordance with a modified Reed-Solomon code for determining an error value in said data symbols and corresponding address symbols, where $$P_A = \sum_i N_i,$$

$N_i$ being said data symbols and corresponding address symbols;
generating a second ($P_B$) of said parity symbols, where $$P_B = \sum_i \alpha^i N_i,$$

$\alpha$ being a primitive element in a Galois Field ($2^m$) where m is the number of bits in said symbols, said $P_B$ providing for locating a single symbol error of said data symbols and symbols of said address;
generating a third ($P_C$) of said parity symbols where $$P_i = \sum_i \alpha^{2i} N_i$$

for detecting at least two symbol errors of said data symbols and corresponding address symbols;

generating said $N_i$, $\alpha_i N_i$ and $\alpha^{2i} N_i$ product terms which produce said $P_A$, $P_B$ and $P_C$ parity symbols in accordance with said Galois Field of $2^m$ elements with means coupled to said data symbols and address symbols;

generating syndromes with means coupled to said parity symbol generator means and said parity symbol outputs of said memory means, said syndromes providing information to perform error detection and correction of said codeword; and performing error correction with means coupled to said syndromes generating means.

23. The method as recited in claim 22 wherein:

said step of generating syndromes to perform error detection and correction of said codeword includes single data symbol error correction, double data symbol error detection, single address symbol error detection, double address symbol error detection and single and double parity symbol error detection.

24. The method as recited in claim 23 wherein said error detection and correction of said codeword further includes the step of performing detection of any combination of two errors from said data symbols, address symbols and parity symbols.

25. The method as recited in claim 22 wherein:

said step of generating said product terms further comprises the step of adding a padded bit to a data symbol input and an address symbol input for matching the number of symbol bits to the bit width of a memory chip in said memory means.

26. A memory system comprising:

memory means for storing a codeword including data symbols and parity symbols into a location of said memory means and reading said codeword from said emory means in accordance with a control signal and an address of said codeword location;

means for generating said parity symbols m bits wide for each codeword in accordance with a Reed-Solomon code using q bit symbols for said data symbols and address symbols when m bit symbols are required for said Reed-Solomon code where m is equal to q +1; and means for padding said data symbols and address symbols with a logic zero in said parity symbol generating means to obtain said q +1 bits of said m bit symbols.

27. A method of detecting errors in a memory system comprising the steps of:

storing a codeword including data symbols and parity symbols into a location of a memory means and reading said codeword from said memory means in accordance with a control signal and an address of said codeword location;

generating said parity symbols of m bits wide for each codeword in accordance with a Reed-Solomon code using q bit symbols for said data symbols and address symbols when m bit symbols are required for said Reed-Solomon code where m is equal to x +1; and padding said data symbols and address symbols with a logic zero in said parity symbol generating means to obtain said q +1 bits of said m bit symbols.

* * * * *